(12) United States Patent
Chiang et al.

(10) Patent No.: US 8,273,651 B2
(45) Date of Patent: *Sep. 25, 2012

(54) METHOD FOR FABRICATING WIRING STRUCTURE OF WIRING BOARD

(75) Inventors: Shu-Sheng Chiang, Taipei (TW);
Tsung-Yuan Chen, Zhongli (TW);
Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 267 days.

This patent is subject to a terminal disclaimer.

(21) Appl. No.: 12/815,155

(22) Filed: Jun. 14, 2010

(65) Prior Publication Data

US 2011/0147342 A1    Jun. 23, 2011

(30) Foreign Application Priority Data

Dec. 22, 2009  (TW) ............................... 98144177 A

(51) Int. Cl.
*H01L 21/4763* (2006.01)

(52) U.S. Cl. ......... 438/618; 438/622; 438/624; 438/687

(58) Field of Classification Search .................. None
See application file for complete search history.

(56) References Cited

U.S. PATENT DOCUMENTS

| 6,930,257 | B1 | 8/2005 | Hiner et al. |
| 6,967,124 | B1 | 11/2005 | Huemoeller et al. |
| 2002/0055256 | A1* | 5/2002 | Jiang ............................... 438/687 |
| 2009/0280636 | A1* | 11/2009 | Hsu et al. ....................... 438/618 |
| 2011/0074039 | A1* | 3/2011 | Zhang et al. ................... 257/774 |
| 2011/0139494 | A1* | 6/2011 | Yu et al. ......................... 174/255 |

FOREIGN PATENT DOCUMENTS

| CN | 1956635 A | 5/2007 |
| TW | 396568 | 4/1998 |
| TW | 484203 | 12/2000 |
| TW | I310599 | 7/2006 |
| TW | 200950634 A1 | 12/2009 |

* cited by examiner

*Primary Examiner* — Duy Deo
(74) *Attorney, Agent, or Firm* — Morris Manning & Martin LLP; Tim Tingkang Xia, Esq.

(57) ABSTRACT

A method for fabricating a wiring structure of a wiring board is provided. First, a substrate including an insulation layer and a film disposed on the insulation layer is provided. Next, an intaglio pattern exposing the insulation layer is formed on an outer surface of the film. The intaglio pattern is formed by removing a portion of the insulation layer and a portion of the film. Next, an activated layer is formed on the outer surface and in the intaglio pattern. The activated layer completely covers the outer surface and all surfaces of the intaglio pattern. Then, the film and the activated layer on the outer surface are removed, and the activated layer in the intaglio pattern is remained. After the film and the activated layer on the outer surface are removed, a conductive material is formed in the intaglio pattern by chemical deposition method.

19 Claims, 3 Drawing Sheets

METHOD FOR FABRICATING WIRING STRUCTURE OF WIRING BOARD

CROSS-REFERENCE TO RELATED APPLICATION

This application claims the benefit of Taiwan Patent Application No. 098144177, filed on Dec. 22, 2009, which is hereby incorporated by reference for all purposes as if fully set forth herein.

BACKGROUND OF THE INVENTION

1. Field of Invention

The present invention relates to a process of fabricating a wiring board, and more particularly to a method for fabricating a wiring structure of a wiring board.

2. Related Art

In a current technology for fabricating a wiring board, a wiring structure of the wiring board is usually formed by using electroless plating or electrical plating. Particularly, in a recent process of fabricating the wiring structure, usually perform electroless plating at first, so as to form a seed layer and a chemical plating layer in sequence on a dielectric layer, wherein the seed layer and the chemical plating layer completely cover the surface of the dielectric layer.

Next, a patterned photoresist layer is formed on the chemical plating layer by using a lithography method, and the patterned photoresist layer partially exposes the chemical plating layer. Then, perform the electrical plating, so as to form a plated metal layer on the chemical plating layer. Afterwards, perform an etching method and remove a portion of the chemical plating layer, so as to form a wiring layer. Thus, the wiring structure of the wiring board is completed.

SUMMARY OF THE INVENTION

The present invention is directed to a method for fabricating a wiring structure of a wiring board.

The present invention provides a method for fabricating a wiring structure of a wiring board. In the method, first, a substrate including an insulation layer and a film disposed on the insulation layer is provided, and the film has an outer surface. Next, an intaglio pattern partially exposing the insulation layer is formed on the outer surface by removing a portion of the insulation layer and a portion of the film. Next, an activated layer is formed on the outer surface and in the intaglio pattern, and the activated layer completely covers the outer surface and all surfaces of the intaglio pattern. Then, the activated layer on the outer surface and the film are removed, and the activated layer in the intaglio pattern is remained. After the film and the activated layer on the outer surface are removed, a conductive material is formed in the intaglio pattern by using a chemical deposition method. The activated layer involves in chemical reactions of the chemical deposition method.

In the present invention, the conductive material is formed in the intaglio pattern by using the activated layer remained in the intaglio pattern and the chemical deposition method. Thus, the wiring structure of the wiring board is manufactured.

In order to make the aforementioned features and advantages of the present invention comprehensible, embodiments accompanied with figures are described in detail below.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
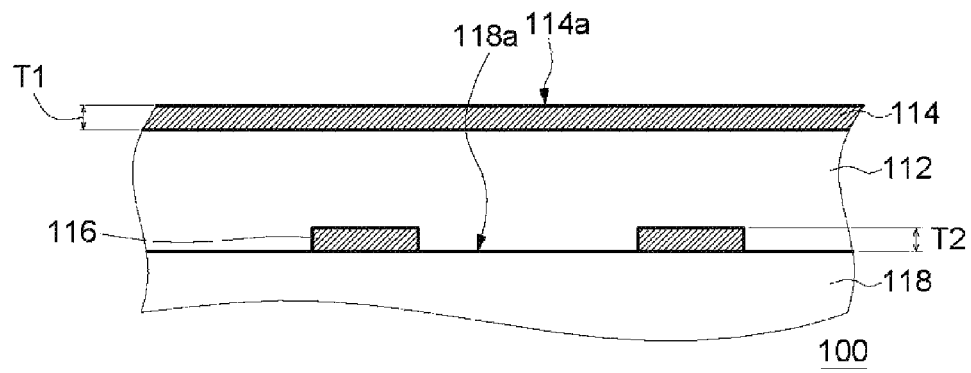
FIGS. 1A to 1E are schematic views illustrating processes of a method for fabricating a wiring structure of a wiring board according to an embodiment of the present invention.

FIGS. 1A to 1E are schematic views illustrating processes of a method for fabricating a wiring structure of a wiring board according to an embodiment of the present invention. Referring to FIG. 1A, in the method for fabricating a wiring structure of a wiring board of this embodiment, firstly a substrate 110 is provided. The substrate 110 includes an insulation layer 112 and a film 114. The film 114 is disposed on the insulation layer 112 and has an outer surface 114a.

The film 114 may be a metal layer, and the material of the metal layer is such as copper, nickel, chromium, or aluminum. The insulation layer 112 may be formed of a prepreg, that is, the insulation layer 112 may be a film mixed with resin and glass fiber. In addition, the insulation layer 112 may also be a polymer material layer, and the material of the polymer material layer is such as polyimide (PI), liquid crystal polymer (LCP), or ajinomoto build-up film (ABF).

When the film 114 is the metal layer, a method for forming the substrate 110 may be depositing the metal layer on the insulation layer 112, and a method for depositing the metal layer may be sputtering or electroless plating. In addition, the method for forming the substrate 110 is laminating a metal foil on the insulation layer 112, and the metal foil is such as a copper foil or a resin coated copper foil (RCC).

Accordingly, after the metal foil is laminated, the thickness of the metal foil is reduced, so as to form the film 114. The method for reducing the thickness of the metal foil is, for example, etching the metal foil. Thus, a portion of the metal foil can be removed, thereby reducing the thickness of the metal foil.

In this embodiment, the substrate 110 may further include a wiring layer 116 and an inner wiring substrate 118. The wiring layer 116 is located on a position opposite to the film 114 and electrically connected to the inner wiring substrate 118. The insulation layer 112 and the wiring layer 116 are both disposed on the inner wiring substrate 118, and the insulation layer 112 covers the wiring layer 116 and a surface 118a of the inner wiring substrate 118. In addition, the thickness T2 of the wiring layer 116 is greater than the thickness T1 of the film 114.

At least one wiring layer (not shown) exists inside the wiring substrate 118. In other words, the inner wiring substrate 118 may be substantially considered as a wiring board, and in a subsequent fabricating process, the wiring layer is formed on the insulation layer 112, so that the method for fabricating the wiring structure of this embodiment may be applied to fabricating a multilayer wiring board.

In addition, in other not shown embodiments, the wiring layer 116 and the inner wiring substrate 118 are both selective elements and not necessary elements. That is, the substrate 110 not necessarily includes the wiring layer 116 and the inner wiring substrate 118, and the method for fabricating the wiring structure of this embodiment may also be applied to fabricating a single-sided wiring board or a double-sided wiring board.

In detail, when the substrate 110 includes the wiring layer 116, but not includes the inner wiring substrate 118, the method for fabricating the wiring structure of this embodiment may be applied to fabricating the double-sided wiring board. When the substrate 110 does not include the wiring layer 116 and the inner wiring substrate 118, the method for fabricating the wiring structure of this embodiment may be applied to fabricating the single-sided wiring board.

Figure 1B:
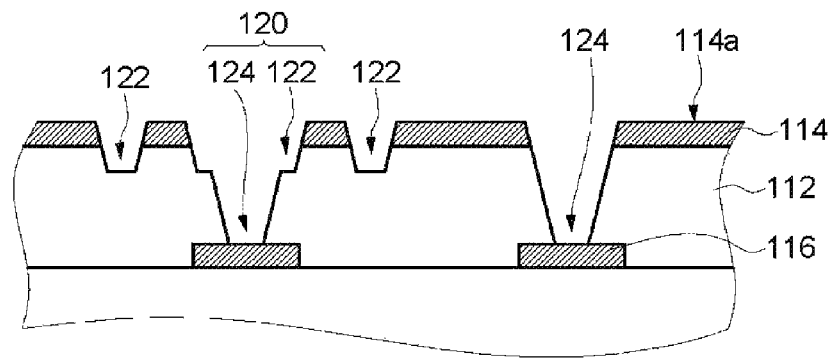

Referring to FIGS. 1A and 1B, next, an intaglio pattern 120 is formed on the outer surface 114a. The intaglio pattern 120 partially exposes the insulation layer 112 and is formed by removing a portion of the film 114 and a portion of the insulation layer 112. A method for forming the intaglio pattern 120 may perform laser ablation or plasma etching to the substrate 110.

In FIG. 1B, the intaglio pattern 120 may include a plurality of trenches 122 partially exposing the insulation layer 112 and a plurality of blind vias 124. At least one blind via 124 is located under one of the trenches 122 and communicates with the trench 122. In addition, in other not shown embodiments, the number of the blind via 124 included by the intaglio pattern 120 may be only one, so the number of the blind via 124 as shown in FIG. 1B is only used for an exemplary description without limiting the present invention.

In the process of forming the intaglio pattern 120, the trenches 122 are formed on the outer surface 114a of the film 114 by using, for example, laser ablation or plasma etching. Next, the blind vias 124 partially exposing the wiring layer 116 are formed, and a method for forming the blind vias 124 may perform mechanical drilling, laser drilling, or plasma etching to the substrate 110.

It is noted that in other not shown embodiments, the intaglio pattern 120 may only include the trenches 122 or the blind vias 124. That is, the intaglio pattern 120 only includes the trenches 122, but not includes any blind vias 124, or the intaglio pattern 120 only includes at least one blind via 124, but not includes any trench 122. Therefore, the intaglio pattern 120 as shown in FIG. 1B is not used to limit the present invention.

Figure 1C:
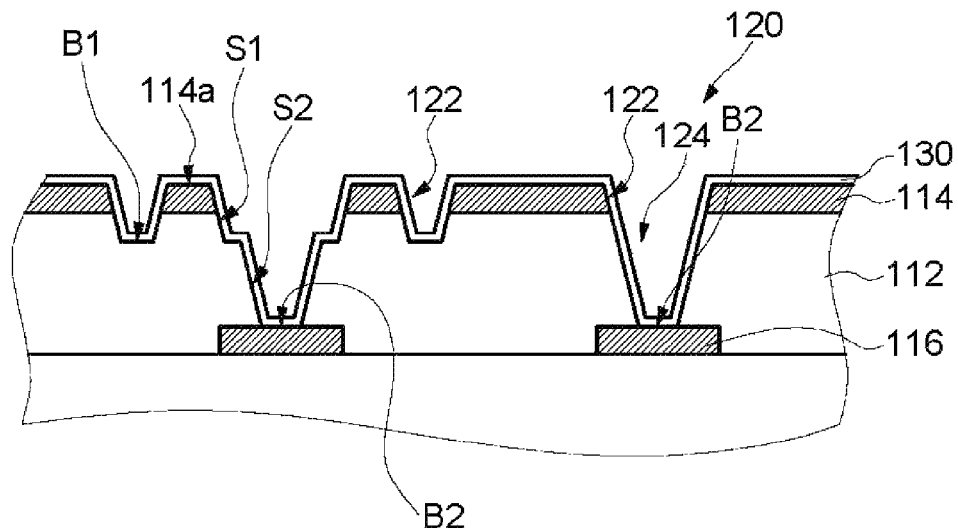

Referring to FIG. 1C, next, an activated layer 130 is formed on the outer surface 114a and in the intaglio pattern 120. The activated layer 130 completely covers the outer surface 114a and all surfaces of the intaglio pattern 120. In detail, taking FIG. 1C as an example, the activated layer 130 not only completely covers the outer surface 114a, but also completely covers the bottoms B1, B2 and side walls S1, S2 of the trenches 122 and the blind vias 124. That is to say, the activated layer 130 also partially covers the wiring layer 116. In addition, the activated layer 130 can contact with the insulation layer 112, the film 114, and the wiring layer 116.

The method for forming the activated layer 130 has many implementation means, and in this embodiment, the method for forming the activated layer 130 may perform dipping the film 114 and the insulation layer 112 into an ionic solution (not shown). The ionic solution contains a plurality of metal ions, and the metal ions are such as nickel ions, palladium ions, platinum ions, chromium ions, silver ions, or molybdenum ions. When the film 114 and the insulation layer 112 are dipped in the ionic solution, the film 114 and the insulation layer 112 are both combined with the metal ions, thereby forming the activated layer 130.

Figure 1D:
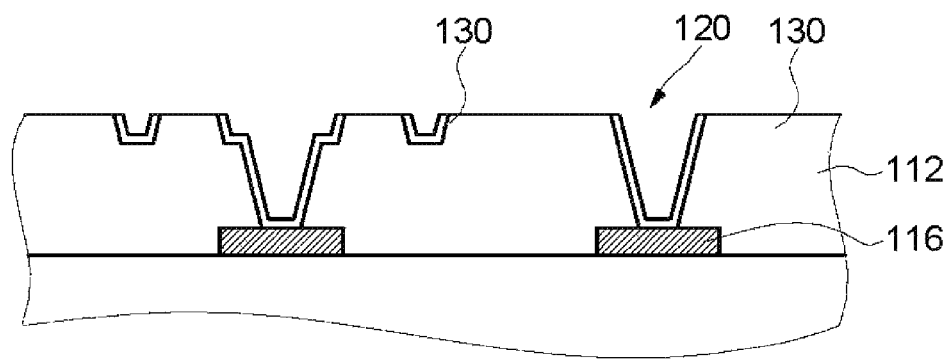

Referring to FIGS. 1C and 1D, next, the film 114 and the activated layer 130 on the outer surface 114a are removed, so as to partially expose the insulation layer 112, and the activated layer 130 in the intaglio pattern 120 is remained. A method for removing the film 114 and the activated layer 130 may perform a micro-etching process. In the micro-etching process, both the film 114 and the activated layer 130 are dipped in the same etchant, and can be removed by the etchant.

Figure 1E:
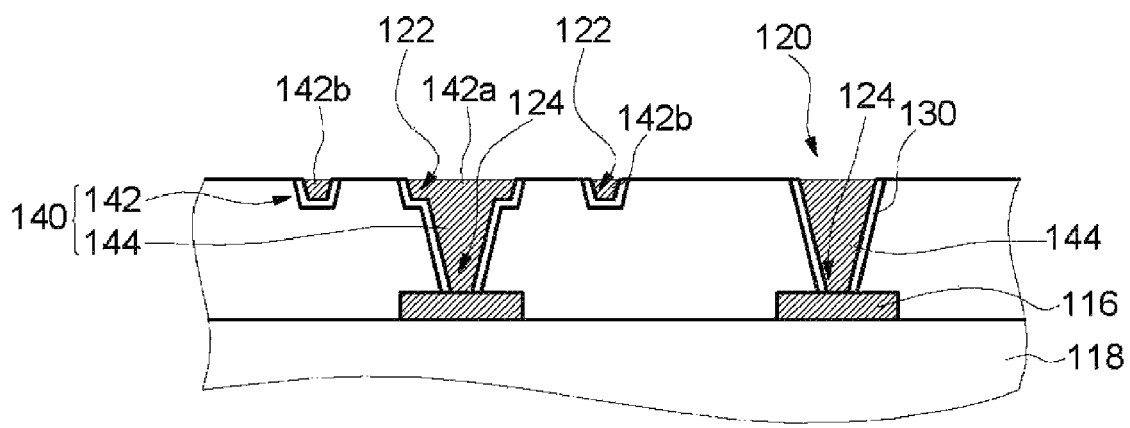

Referring to FIGS. 1D and 1E, then, a conductive material 140 is formed in the intaglio pattern 120 by using a chemical deposition method, and the chemical deposition method may be chemical vapor deposition (CVD) or electroless plating. The wiring structure of the wiring board is substantially manufactured so far. The activated layer 130 involves in chemical reactions of the chemical deposition method, that is, the conductive material 140 is formed through the chemical reactions occurred from the activated layer 130, such that the chemical deposition method limits the formation of the conductive material 140, so as to enable the conductive material 140 to be formed on the activated layer 130 only.

In addition, in the process of forming the conductive material 140, a patterned conductive layer 142 may be formed in the trenches 122, and conductive posts 144 are formed in the blind vias 124. The patterned conductive layer 142 is a wiring layer, that is, the patterned conductive layer 142 includes a pad 142a and a plurality of traces 142b. Therefore, the conductive material 140 includes the patterned conductive layer 142 and at least one conductive post 144.

Accordingly, the conductive posts 144 may be electrically connected between the patterned conductive layer 142 and the wiring layer 116, such that the patterned conductive layer 142 is electrically connected to the inner wiring substrate 118 through the conductive posts 144 and the wiring layer 116. Further, the blind vias 124 may be filled with the conductive posts 144. However, in other not shown embodiments, the blind vias 124 may also not be filled with the conductive posts 144, so the conductive post 144 as shown in FIG. 1E do not limit the present invention.

It is noted that in other not shown embodiment, the intaglio pattern 120 may only include the trench 122 or the blind via 124, such that in the process of forming the conductive material 140, only the conductive posts 144 or the patterned conductive layer 142 may be formed.

In detail, when the intaglio pattern 120 only includes the blind via 124 but not includes any trench 122, only the conductive posts 144 are formed, but the patterned conductive layer 142 is not formed. When the intaglio pattern 120 only includes the trenches 122 but not includes any blind via 124, only the patterned conductive layer 142 is formed, but the conductive post 144 is not formed.

In view of the foregoing, in the present invention, the conductive material is formed in the intaglio pattern by using the activated layer remained in the intaglio pattern and the chemical deposition method, so as to fabricate the wiring structure including the wiring layer (that is, the patterned conductive layer) or the conductive post. As compared with the conventional method for fabricating the wiring structure of the wiring board, in the present invention, the wiring structure may be manufactured without forming any patterned photoresist layer, and a lithography step may be omitted as well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a wiring structure of a wiring board, comprising:
   providing a substrate comprising an insulation layer and a film disposed on the insulation layer, wherein the film has an outer surface
   forming an intaglio pattern partially exposing the insulation layer on the outer surface, wherein the intaglio pattern is formed by removing a portion of the insulation layer and a portion of the film;
   forming an activated layer on the outer surface and in the intaglio pattern, wherein the activated layer completely covers the outer surface and all surfaces of the intaglio pattern;
   removing the activated layer on the outer surface and the film, and remaining the activated layer in the intaglio pattern; and
   forming a conductive material in the intaglio pattern by using a chemical deposition method after removing the film and the activated layer on the outer surface, wherein the conductive material is formed through the chemical reactions occurred from the activated layer remained in the intaglio pattern.

2. The method for fabricating a wiring structure of a wiring board according to claim 1, wherein the chemical deposition method comprises an electroless plating.

3. The method for fabricating a wiring structure of a wiring board according to claim 1, wherein the chemical deposition method is a chemical vapor deposition (CVD).

4. The method for fabricating a wiring structure of a wiring board according to claim 1, wherein a method for forming the activated layer comprises dipping the film and the insulation layer into an ionic solution containing a plurality of metal ions.

5. The method for fabricating a wiring structure of a wiring board according to claim 4, wherein the metal ions are nickel ions, palladium ions, platinum ions, chromium ions, silver ions, or molybdenum ions.

6. The method for fabricating a wiring structure of a wiring board according to claim 1, wherein a method for removing the activated layer on the outer surface and the film comprises a micro-etching.

7. The method for fabricating a wiring structure of a wiring board according to claim 1, wherein the film is a metal layer, and a method for forming the substrate comprises depositing the metal layer on the insulation layer.

8. The method for fabricating a wiring structure of a wiring board according to claim 7, wherein a method for depositing the metal layer comprises a sputtering or an electroless plating.

9. The method for fabricating a wiring structure of a wiring board according to claim 1, wherein a method for forming the substrate comprises:
   laminating a metal foil on the insulation layer; and
   reducing a thickness of the metal foil after laminating the metal foil.

10. The method for fabricating a wiring structure of a wiring board according to claim 9, wherein the metal foil is a copper foil or a resin coated copper foil (RCC).

11. The method for fabricating a wiring structure of a wiring board according to claim 1, wherein a method for forming the intaglio pattern comprises performing laser ablation or plasma etching to the substrate.

12. The method for fabricating a wiring structure of a wiring board according to claim 1, wherein the process of forming the intaglio pattern comprises forming a plurality of trenches partially exposing the insulation layer on the outer surface.

13. The method for fabricating a wiring structure of a wiring board according to claim 12, wherein the process of forming the conductive material comprises forming a patterned conductive layer in the trenches.

14. The method for fabricating a wiring structure of a wiring board according to claim 1, wherein the substrate further comprises a wiring layer, the wiring layer is located on a position opposite to the film, a thickness of the wiring layer is greater than a thickness of the film, and the insulation layer covers the wiring layer.

15. The method for fabricating a wiring structure of a wiring board according to claim 14, wherein the substrate further comprises an inner wiring substrate, both the insulation layer and the wiring layer are disposed on the inner wiring substrate, and the wiring layer is electrically connected to the inner wiring substrate.

16. The method for fabricating a wiring structure of a wiring board according to claim 14, wherein the process of forming the intaglio pattern comprises forming at least one blind via partially exposing the wiring layer.

17. The method for fabricating a wiring structure of a wiring board according to claim 16, wherein a method for forming the blind via comprises performing mechanical drilling, laser drilling, or plasma etching to the substrate.

18. The method for fabricating a wiring structure of a wiring board according to claim 16, wherein the process of forming the conductive material comprises forming a conductive post in the blind via.

19. The method for fabricating a wiring structure of a wiring board according to claim 18, wherein the blind via is filled with the conductive post.

* * * * *